(12) United States Patent
Li et al.

(10) Patent No.: US 10,615,363 B2
(45) Date of Patent: Apr. 7, 2020

(54) COVER PLATE AND FABRICATING METHOD THEREOF, DISPLAY PANEL AND DISPLAY DEVICE

(71) Applicant: BOE TECHNOLOGY GROUP CO., LTD., Beijing (CN)

(72) Inventors: Wei Li, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/408,905

(22) Filed: May 10, 2019

(65) Prior Publication Data
US 2020/0052241 A1    Feb. 13, 2020

(30) Foreign Application Priority Data

Aug. 10, 2018    (CN) .......................... 2018 1 0912110

(51) Int. Cl.
*H01L 27/14*    (2006.01)
*H01L 51/52*    (2006.01)
*H01L 27/32*    (2006.01)
*H01L 51/56*    (2006.01)

(52) U.S. Cl.
CPC ........ *H01L 51/5237* (2013.01); *H01L 27/322* (2013.01); *H01L 27/3227* (2013.01); *H01L 27/3244* (2013.01); *H01L 51/5228* (2013.01); *H01L 51/5234* (2013.01); *H01L 51/5284* (2013.01); *H01L 51/56* (2013.01)

(58) Field of Classification Search
CPC .............. H01L 27/322; H01L 27/3227; H01L 27/3244; H01L 51/5237; H01L 51/5228; H01L 51/5234; H01L 51/5284; H01L 51/56
USPC ....................................... 257/40, 59, 72, 432
See application file for complete search history.

(56) References Cited

U.S. PATENT DOCUMENTS 9,825,256 B2 *   11/2017   Qi ....................... H01L 51/5206

* cited by examiner

*Primary Examiner* — Tan N Tran
(74) *Attorney, Agent, or Firm* — Thomas | Horstemeyer LLP

(57) ABSTRACT

The present disclosure provides a cover plate, a fabricating method thereof, a display panel, and a display device. The cover plate includes a first substrate; a thin film transistor, an optical sensor, and a first electrode on the optical sensor which are sequentially disposed on the first substrate; a passivation layer covering the thin film transistor and the first electrode; a black matrix disposed on the passivation layer; an electrode connection layer disposed on the black matrix, the electrode connection layer including an auxiliary cathode and a first electrode connection line disposed in the same layer, and the first electrode connection line being connected with the first electrode by a first electrode connection hole penetrating through the passivation layer; and a planar layer and a second electrode sequentially disposed, the second electrode being connected with the auxiliary cathode by a second electrode connection hole penetrating through the planar layer.

15 Claims, 6 Drawing Sheets

COVER PLATE AND FABRICATING METHOD THEREOF, DISPLAY PANEL AND DISPLAY DEVICE

CROSS-REFERENCE TO RELATED APPLICATIONS

The present application is based on, and claims the benefit of and priority to, Chinese Patent Application No. 201810912110.3, filed on Aug. 10, 2018, where the entire contents of which are incorporated herein by reference.

TECHNICAL FIELD

The present disclosure relates to the field of display technologies, and in particular, to a cover plate and a fabricating method thereof, a display panel, and a display device.

BACKGROUND

The OLED (Organic Light-emitting Diode) display panel may include a top emission type OLED display panel and a bottom emission type OLED display panel, and the light of the top emission type OLED display panel is emitted from a side of the cathode. In order to ensure the transmittance of light, it is necessary to reduce the thickness of the cathode, however, a resistance of the cathode increases as the thickness of the cathode decreases. Therefore, an auxiliary cathode may be disposed on the cover plate in the top emission type OLED display panel to reduce the resistance of the cathode, thereby improving the display quality of the top emission type OLED display panel. At the same time, in order to further improve the display quality of the OLED display panel, an optical sensor is disposed on the cover plate in the OLED display panel, by which the brightness of each pixel in the display panel is detected, and the pixel is optically compensated when the brightness of light emitting of the pixel is low.

However, when the auxiliary cathode and the optical sensor are simultaneously disposed on the cover plate in the top emission type OLED display panel, the entire fabricating process is complicated with a high cost, and the occupied space of the cover plate in the display panel is increased.

SUMMARY

The present disclosure discloses a fabricating method of a cover plate, including:

sequentially forming a thin film transistor, an optical sensor, and a first electrode on the optical sensor on the first substrate through a patterning process;

forming a passivation layer covering the thin film transistor and the first electrode;

forming a black matrix and a first electrode connection hole penetrating through the passivation layer on the passivation layer through a patterning process;

forming an electrode connection layer on the black matrix through a patterning process;

the electrode connection layer including an auxiliary cathode and a first electrode connection line which are disposed in the same layer, and the first electrode connection line being connected with the first electrode through the first electrode connection hole; and sequentially forming a planar layer and a second electrode through a patterning process, the second electrode being connected with the auxiliary cathode by a second electrode connection hole penetrating through the planar layer.

Alternatively, the step of sequentially forming a planar layer and a second electrode through the patterning process includes:

forming a color filter layer on the passivation layer through a patterning process;

forming the planar layer covering the electrode connection layer, the black matrix, and the color filter layer;

sequentially forming a support pillar and a second electrode connection hole penetrating through the planar layer on the planar layer through a patterning process;

forming the second electrode through a patterning process, the second electrode covering the support pillar, and being connected with the auxiliary cathode through the second electrode connection hole.

Alternatively, the step of forming a color filter layer on the passivation layer through the patterning process includes: providing an orthographic projection of the color filter layer on the passivation layer partially covering the black matrix and the first electrode connection line.

Alternatively, the step of sequentially forming a thin film transistor, an optical sensor, and a first electrode on the optical sensor on the first substrate through the patterning process includes:

forming a buffer layer on the first substrate;

forming an active layer on the buffer layer through a patterning process;

sequentially forming a gate insulating layer and a gate electrode on the active layer through a patterning process;

forming an interlayer dielectric layer through a patterning process, the interlayer dielectric layer covering the buffer layer, the active layer, the gate insulating layer, and the gate electrode;

forming a source electrode and a drain electrode on the interlayer dielectric layer through a patterning process, the source electrode and the drain electrode being respectively connected with the active layer through via holes on the interlayer dielectric layer;

forming an optical sensor on the drain electrode; and forming the first electrode at a surface of the optical sensor facing away from the drain electrode.

The present disclosure also discloses a cover plate, including:

a first substrate;

a thin film transistor, an optical sensor, and a first electrode on the optical sensor which are sequentially disposed on the first substrate;

a passivation layer covering the thin film transistor and the first electrode;

a black matrix disposed on the passivation layer;

an electrode connection layer disposed on the black matrix, the electrode connection layer including an auxiliary cathode and a first electrode connection line disposed in the same layer, and the first electrode connection line being connected with the first electrode by a first electrode connection hole penetrating through the passivation layer;

a planar layer and a second electrode sequentially disposed, the second electrode being connected with the auxiliary cathode by a second electrode connection hole penetrating through the planar layer.

Alternatively, the cover plate further includes a color filter layer disposed on the passivation layer and a support pillar, where the planar layer covers the electrode connection layer, the black matrix, and the color filter layer; the support pillar is disposed on the planar layer; the second electrode covers the support pillar, and is connected with the auxiliary cathode through the second electrode connection hole.

Alternatively, an orthographic projection of the color filter layer on the passivation layer partially covers the black matrix and the first electrode connection line.

Alternatively, the electrode connection layer has a thickness of 2000 Å to 5000 Å.

Alternatively, the thin film transistor includes:

a buffer layer disposed on the first substrate;

an active layer disposed on the buffer layer;

a gate insulating layer and a gate electrode sequentially disposed on the active layer;

an interlayer dielectric layer covering the buffer layer, the active layer, the gate insulating layer, and the gate electrode;

a source electrode and a drain electrode disposed on the interlayer dielectric layer, the source electrode and the drain electrode being respectively connected with the active layer through via holes on the interlayer dielectric layer.

Alternatively, the optical sensor is disposed on the drain electrode, and the first electrode is disposed at a surface of the optical sensor facing away from the drain electrode.

The present disclosure also discloses a display panel including the above-described cover plate.

Alternatively, the display panel further includes a display substrate on which the cover plate is disposed;

an anode, an organic light emitting layer, and a cathode stacked on the second substrate, the cathode being in contact with the second electrode.

Alternatively, the cathode is in contact with the second electrode at a position where the support pillar is located.

The present disclosure further discloses a display device including the above display panel.

DETAILED DESCRIPTION

In order to make the above-described objects, features and advantages of the present disclosure more apparent, the present disclosure will be further described in detail with reference to the drawings and the specific embodiments.

Figure 1:
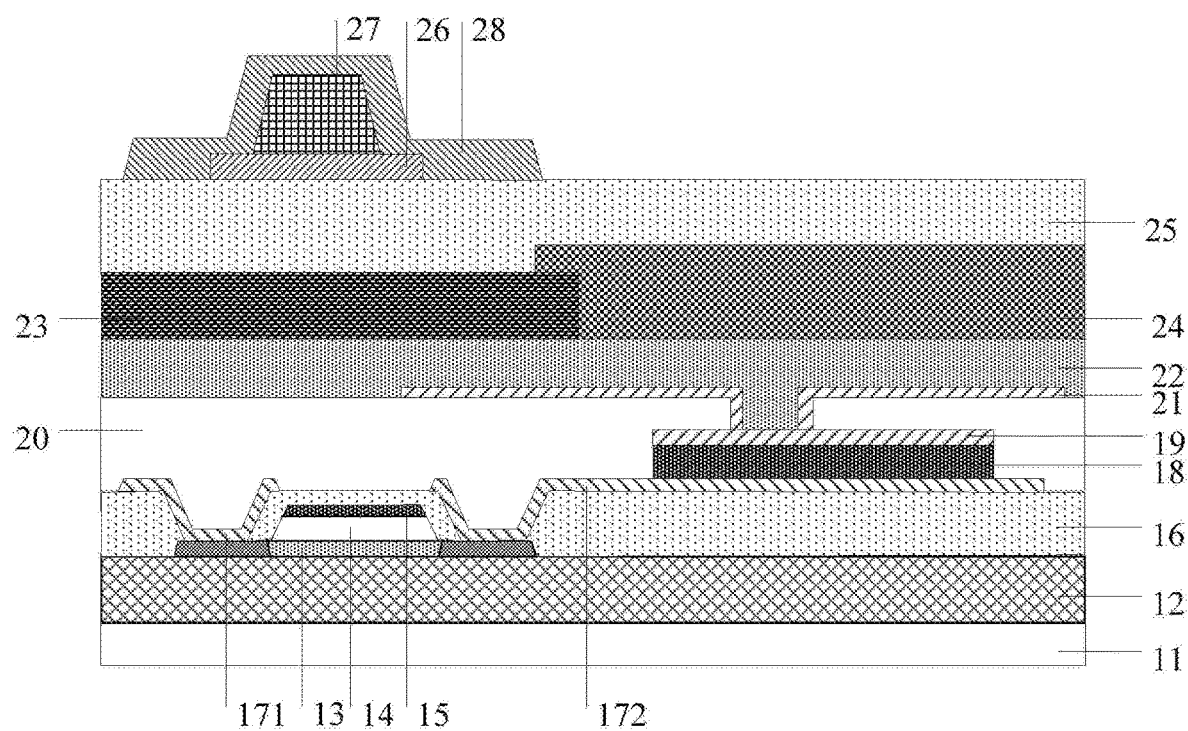
FIG. 1 shows a schematic structural view of a cover plate in a related art.

In the related art, when the auxiliary cathode and the optical sensor are simultaneously disposed on the cover plate in the top emission type OLED display panel, the following steps may be adopted: first, as shown in FIG. 1, sequentially forming a buffer layer 12, an active layer 13, a gate insulating layer (gate insulating layer) 14, and a gate electrode 15 on a first substrate 11, followed by depositing an interlayer dielectric layer 16, forming via holes on the interlayer dielectric layer 16, and forming a source electrode 171 and a drain electrode 172, thereby fabricating a thin film transistor; forming an optical sensor 18 on the drain electrode 172 of the thin film transistor, producing a first electrode 19 on the optical sensor 18, then deposition of the passivation layer 20 is completed, and a first electrode connection hole is disposed on the passivation layer 20 by performing a patterning process; next, forming a first electrode connection line 21 on the passivation layer 20, and connecting the first electrode connection line 21 with the first electrode 19 on the optical sensor 18; then, sequentially producing a resin layer 22, a black matrix 23, a color filter layer 24 and a planar layer 25, forming an auxiliary cathode 26 on the planar layer 25, and forming a support pillar 27 on the auxiliary cathode 26; and finally producing a second electrode 28 on the support pillar 27 which is connected with the auxiliary cathode 26, wherein, in the subsequent process, the second electrode 28 is in contact with the cathode, thereby capable of achieving connection between the auxiliary cathode and cathode, and reducing the resistance of the cathode.

However, when the auxiliary cathode and the optical sensor are simultaneously disposed on the cover plate in the top emission type OLED display panel, the entire fabricating process is complicated and results in a high cost, and the occupied space of the cover plate in the display panel is increased.

The present disclosure provides a cover plate and a fabricating method thereof, a display panel and a display device, so as to solve the problem of the complicated and high-cost fabricating process, and an increasing occupied space of the cover plate in the display panel when the auxiliary cathode and the optical sensor are simultaneously disposed on the cover plate in the related art.

Figure 2:
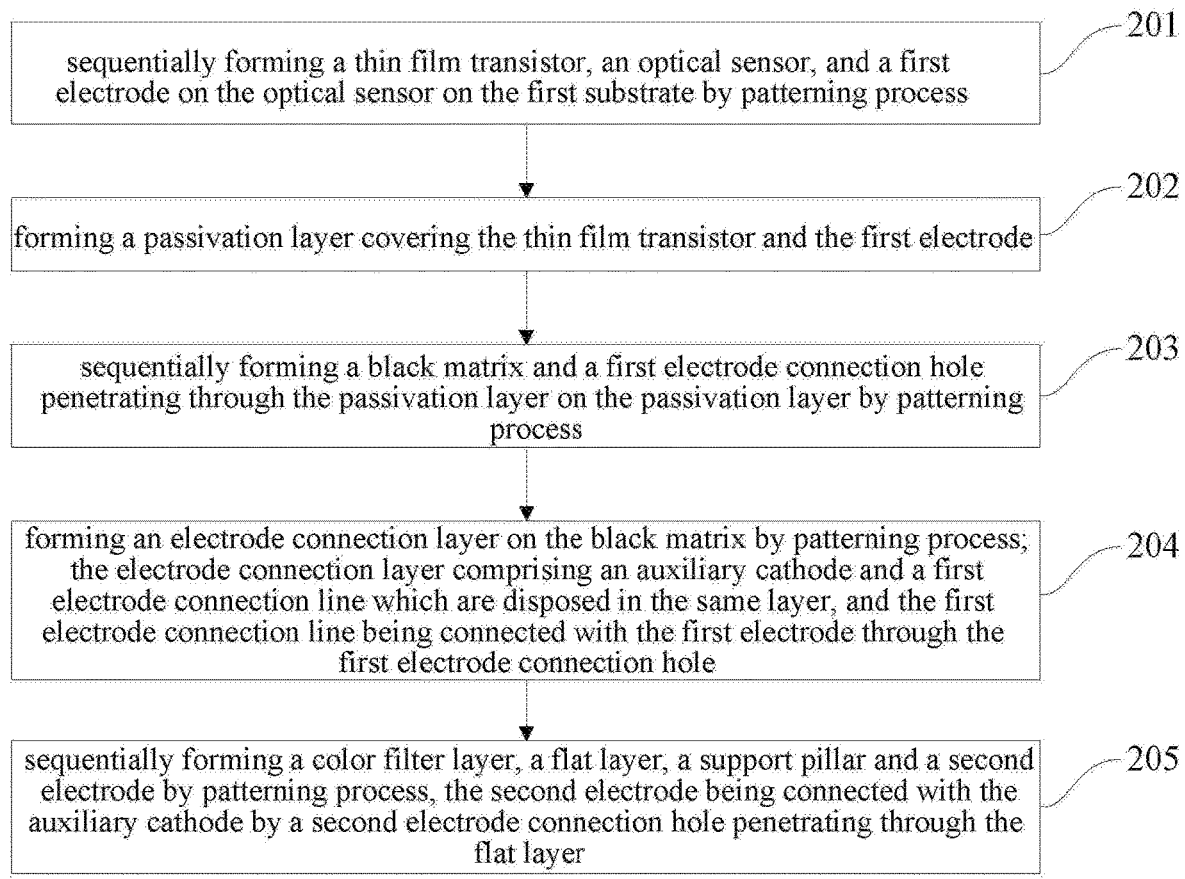
FIG. 2 shows a flow chart of a fabricating method of a cover plate according to an embodiment of the present disclosure.

Referring to FIG. 2, a flow chart of a fabricating method of a cover plate according to an embodiment of the present disclosure is shown.

Step 201: sequentially forming a thin film transistor, an optical sensor, and a first electrode on the optical sensor on a first substrate through a patterning process.

In an embodiment of the present disclosure, the thin film transistor is disposed on the first substrate through a patterning process, the optical sensor is disposed on a drain electrode of the thin film transistor, and the first electrode is disposed on the optical sensor.

The drain electrode of the thin film transistor serves as a lower electrode of the optical sensor at the same time, and the first electrode serves as an upper electrode of the optical sensor; the first electrode may be a transparent conductive material such as ITO (Indium Tin Oxide), IZO (Indium Zinc Oxide), or the like, having a thickness of 400 Å to 1500 Å.

Since the passivation layer needs to be deposited later and the first electrode connection hole is disposed on the passivation layer by etching, the first electrode is disposed on the optical sensor so that the performance of the optical sensor could not be affected during etching, thereby functioning to block etching. In addition, the first electrode on the optical sensor may also function as a connection with the first electrode connection line.

Specifically, a buffer layer is disposed on the first substrate, an active layer is disposed on the buffer layer through a patterning process, and a gate insulating layer and a gate electrode are sequentially disposed on the active layer through a patterning process, an interlayer dielectric layer covering the buffer layer, the active layer, the gate insulating layer and the gate electrode is disposed through a patterning process, a source electrode and a drain electrode are disposed on the interlayer dielectric layer through a patterning process and respectively connected with the active layer through via holes on the interlayer dielectric layer, an optical sensor is disposed on the drain electrode, and the first electrode is disposed at a surface of the optical sensor facing away from the drain electrode.

Figure 3:
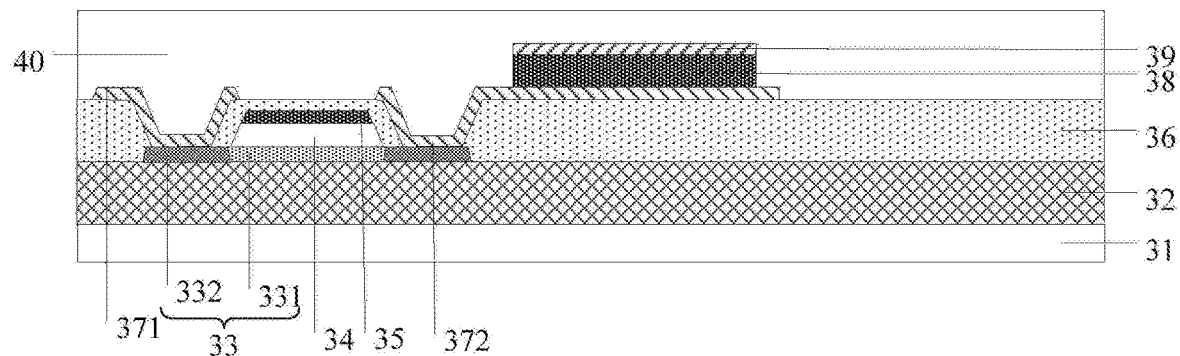
FIG. 3 shows a schematic structural view after forming a thin film transistor, an optical sensor, and a passivation layer in an embodiment of the present disclosure.

As shown in FIG. 3, a buffer layer 32 is deposited on the first substrate 31 by a PECVD (Plasma Enhanced Chemical Vapor Deposition) or other deposition method, and the buffer layer 32 may be silicon oxide (SiOx) layer, a silicon nitride (SiNx) layer, or a composite film layer of silicon nitride and silicon oxide having a thickness of 2000 Å to 5000 Å, for example, 3000 Å, 4000 Å. An active layer thin film is then deposited on the buffer layer 32, and is patterned to form an active layer 33. The active layer 33 is made of IGZO (Indium Gallium Zinc Oxide) and has a thickness of 300 Å to 800 Å, for example, 400 Å. 500 Å, 600 Å, 700 Å. In addition, it is necessary to bombard the active layer 33 with a plasma of inert gas such as helium gas, to realize the conducting of the active layer 33 and reduce the resistance of the active layer 33 after conducted, thereby improving the current transfer efficiency and thus optimizing the performance of the active layer 33. The material of a first portion 331 of the active layer 33 is still a semiconductor material, and the material of a second portion 332 of the active layer 33 is converted from the semiconductor material into a conductor material.

After conducting the conductor layer 33, a gate insulating layer thin film and a gate thin film are deposited on the active layer 33, and the gate insulating layer thin film and the gate thin film are respectively patterned by a self-aligning process to form a gate insulating layer 34 and a gate electrode 35; wherein the gate insulating layer 34 may be referred to as a GI (Gate insulating layer) which is made of silicon oxide and has a thickness of 1000 Å to 2500 Å, for example, 1500 Å, 2000 Å. The gate electrode 35 may be made of metal material such as aluminum, aluminum alloy or copper, and has a thickness of 3000 Å to 6000 Å, for example, 4000 Å, 5000 Å.

Then, an interlayer dielectric layer thin film is deposited, and the interlayer dielectric layer thin film is patterned to form a via hole penetrating through the interlayer dielectric layer 36. The interlayer dielectric layer 36 covers the buffer layer 32, the active layer 33, the gate insulating layer 34, and a gate electrode 35. The interlayer dielectric layer 36 may also be referred to as an ILD (Interlayer Dielectric), and the interlayer dielectric layer 36 is a silicon oxide layer, a silicon nitride layer, or a composite film of silicon nitride and silicon oxide having a thickness of 3000 Å to 6000 Å, for example, 4000 Å, 5000 Å.

Next, a source/drain electrode metal layer is deposited on the interlayer dielectric layer 36, and the source/drain electrode metal layer is patterned to form a source electrode 371 and a drain electrode 372. The source electrode 371 and the drain electrode 372 are respectively connected with the active layer 33 through via holes on the interlayer dielectric layer 36. The source electrode 371 and the drain electrode 372 may be made of metal material such as aluminum, aluminum alloy, or copper, and have a thickness of 3000 Å to 6000 Å, for example, 4000 Å, 5000 Å.

Finally, an optical sensor 38 is disposed on the drain electrode 372, and a first electrode 39 is disposed at the surface of the optical sensor 38 that faces away from the drain electrode 372.

Step 202: forming a passivation layer covering the thin film transistor and the first electrode.

As shown in FIG. 3, after forming the optical sensor 38 and the first electrode 39, a passivation layer 40 is deposited by PECVD or other deposition method. The passivation layer 40 covers the thin film transistor and the first electrode 39, and specifically covers the interlayer dielectric layer 36, the source electrode 371, the drain electrode 372, and the first electrode 39.

The material used for the passivation layer 40 is silicon nitride or silicon oxide.

Step 203: sequentially forming a black matrix and a first electrode connection hole penetrating through the passivation layer on the passivation layer through a patterning process.

Figure 4:
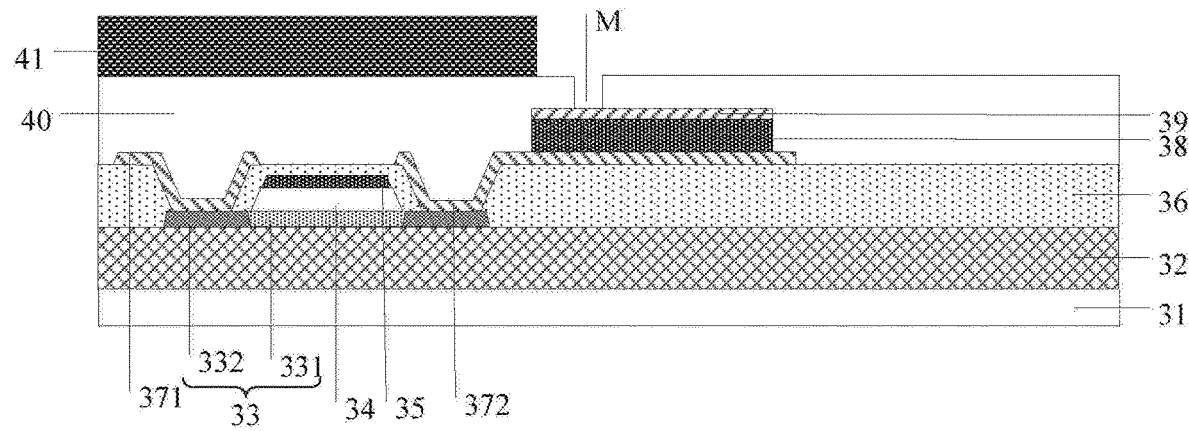
FIG. 4 shows a schematic structural view after forming a black matrix and a first electrode connection hole in an embodiment of the present disclosure.

As shown in FIG. 4, a black matrix 41 is firstly disposed on the passivation layer 40, and then a first electrode connection hole M penetrating through the passivation layer 40 is disposed on the passivation layer 40 through a patterning process. A position of the first electrode connection hole M corresponds to a position of the first electrode 39.

The material of the black matrix 41 is an organic material having a thickness of 1 μm to 3 μm.

It should be noted that, after the passivation layer 40 is disposed, the first electrode connection hole M penetrating through the passivation layer 40 is not first disposed in order to prevent material of the black matrix 41 from being retained in the first electrode connection hole M when the black electrode 41 is deposited after the first electrode connection hole M is disposed, which may affect the performance of the first electrode connection line disposed in the subsequent first electrode connection hole M.

Of course, it is also possible to first form a resin layer on the passivation layer 40, then form the black matrix on the resin layer, and thereafter form the first electrode connection hole penetrating through the resin layer and the passivation layer on the resin layer.

Step 204: forming an electrode connection layer on the black matrix through a patterning process. The electrode connection layer includes an auxiliary cathode and a first electrode connection line which are disposed in the same layer, and the first electrode connection line is connected with the first electrode by the first electrode connection hole.

Figure 5:
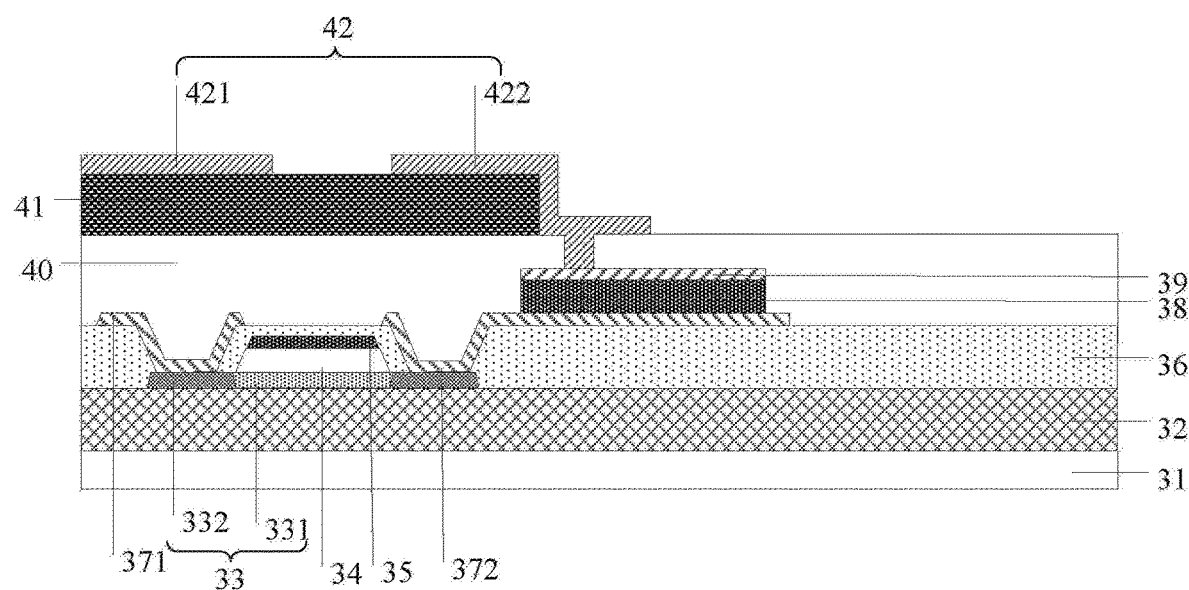
FIG. 5 shows a schematic structural view after forming an electrode connection layer in an embodiment of the present disclosure.

As shown in FIG. 5, an electrode connection layer 42 is disposed on the black matrix 41 through a patterning process. The electrode connection layer 42 includes an auxiliary cathode 421 and a first electrode connection line 422 which are disposed in the same layer, and the first electrode connection line 422 is connected with the first electrode 39 by the first electrode connection hole M.

It should be noted that other metal wirings are also disposed at other positions in the same layer as the gate electrode 35, where the first electrode connection line 422 is connected with the metal wiring in the same layer as the gate electrode 35 through a via hole at a corresponding position (not shown in FIG. 5), or other metal wirings are disposed at other positions in the same layer as the source electrode 371 and the drain electrode 372, where the first electrode connection line 422 is connected with the metal wiring in the same layer as the source electrode 371 and the drain electrode 372 through a via hole at a corresponding position (not shown in FIG. 5). The electrical signal is provided to the metal wiring in the same layer as the gate electrode 35, or to the metal wiring in the same layer as the source electrode 371 and the drain electrode 372, and the first electrode 39 is powered by the first electrode connection line 422. The drain electrode 372 of the thin film transistor serves as a lower electrode of the optical sensor 38. When the thin film transistor is turned on, the lower electrode of the optical sensor 38 also has a voltage so that the optical sensor 38 may be controlled to operate normally.

The material used for the electrode connection layer 42 is a conductive metal, such as a metal material, which may include molybdenum, and may have a thickness of 2000 Å to 5000 Å, for example, 3000 Å, 4000 Å, i.e., the auxiliary cathode 421 and the first electrode connection line 422 has a thickness of 2000 Å to 5000 Å.

The auxiliary cathode 421 and the first electrode connection line 422 may be simultaneously disposed through a patterning process once, which reduces steps of the fabricating process and reduces the fabricating cost, and the auxiliary cathode 421 and the first electrode connection line 422 are disposed in the same layer, thereby saving the occupied space of the cover plate.

Step 205: sequentially forming a color filter layer, a planar layer, a support pillar and a second electrode through a patterning process, wherein the second electrode is connected with the auxiliary cathode by a second electrode connection hole penetrating through the planar layer.

In the embodiment of the present disclosure, after forming the electrode connection layer 42 on the black matrix 41 through a patterning process, a color filter layer 43, a planar layer 44, a support pillar 45, and a second electrode 46 are sequentially disposed through a patterning process, and the second electrode 46 is connected with the auxiliary cathode 421 by a second electrode connection hole N penetrating through the planar layer 44.

Specifically, the color filter layer is disposed on the passivation layer through a patterning process, and an orthographic projection of the color filter layer on the passivation layer partially covers the black matrix and the first electrode connection line. A planar layer covering the electrode connection layer, the black matrix, and the color filter layer is disposed, and the support pillar and the second electrode connection hole penetrating through the planar layer are sequentially disposed on the planar layer through a patterning process. The second electrode is disposed through a patterning process, wherein the second electrode covers the support pillar, and is connected with the auxiliary cathode through the second electrode connection hole.

Figure 6:
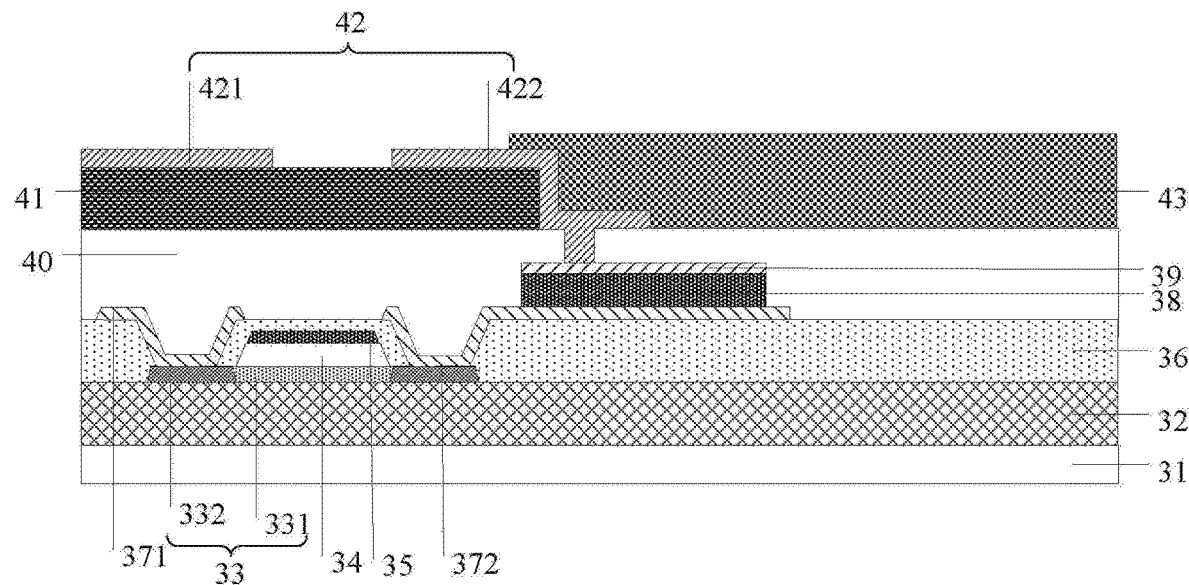
FIG. 6 shows a schematic structural view after forming a color filter layer in an embodiment of the present disclosure.

As shown in FIG. 6, the color filter layer 43 is disposed on the passivation layer 40 through a patterning process, and the orthographic projection of the color filter layer 43 on the passivation layer 40 partially covers the black matrix 41 and the first electrode connection line 422; the material of the color filter layer 43 is an organic material having a thickness of 2 μm to 3 μm.

The orthographic projection of the color filter layer 43 on the passivation layer 40 partially covers the black matrix 41, so as to prevent a gap between the black matrix 41 and the color filter layer 43 which causes light leakage.

Figure 7:
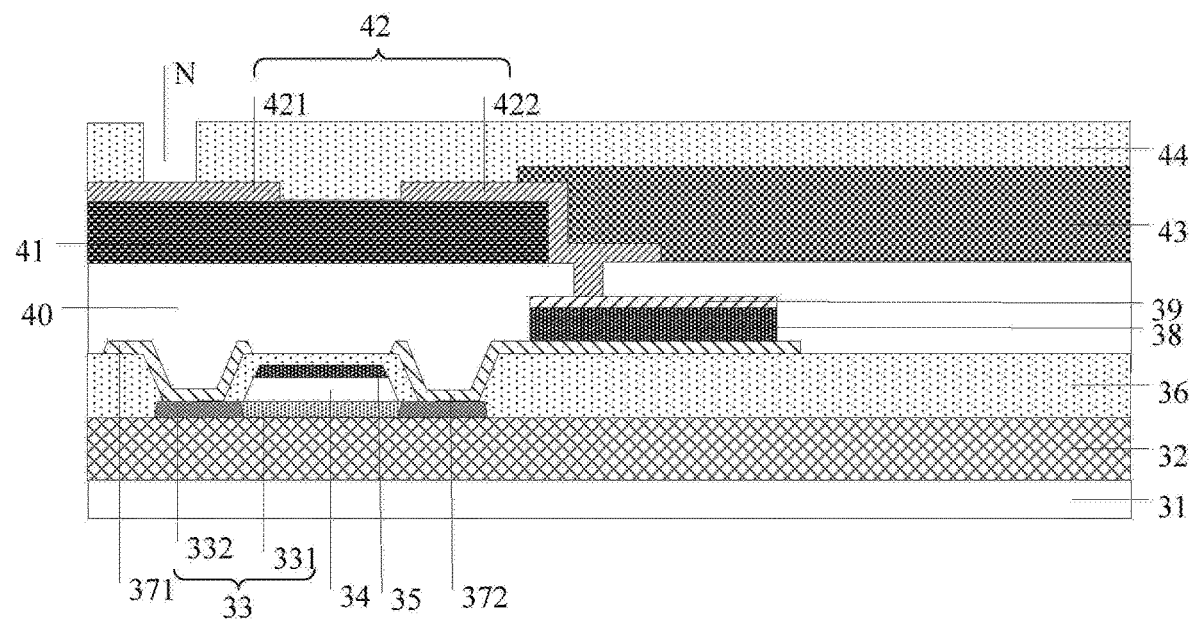
FIG. 7 shows a schematic structural view after forming a planar layer and a second electrode connecting hole in an embodiment of the present disclosure.

As shown in FIG. 7, after forming the color filter layer 43 on the passivation layer 40, the planar layer 44 is then disposed to planarize. The planar layer 44 covers the electrode connection layer 42, the black matrix 41 and the color filter layer 43. The planar layer may also be referred to as OC (Over Coat), which is made of an organic material and has a thickness of 2 μm.

Then, the support pillar 45 and the second electrode connection hole N penetrating through the planar layer 44 are sequentially disposed on the planar layer 44 through a patterning process; wherein the support pillar 45 is made of an organic material having a thickness of 3 μm to 5 μm.

Figure 8:
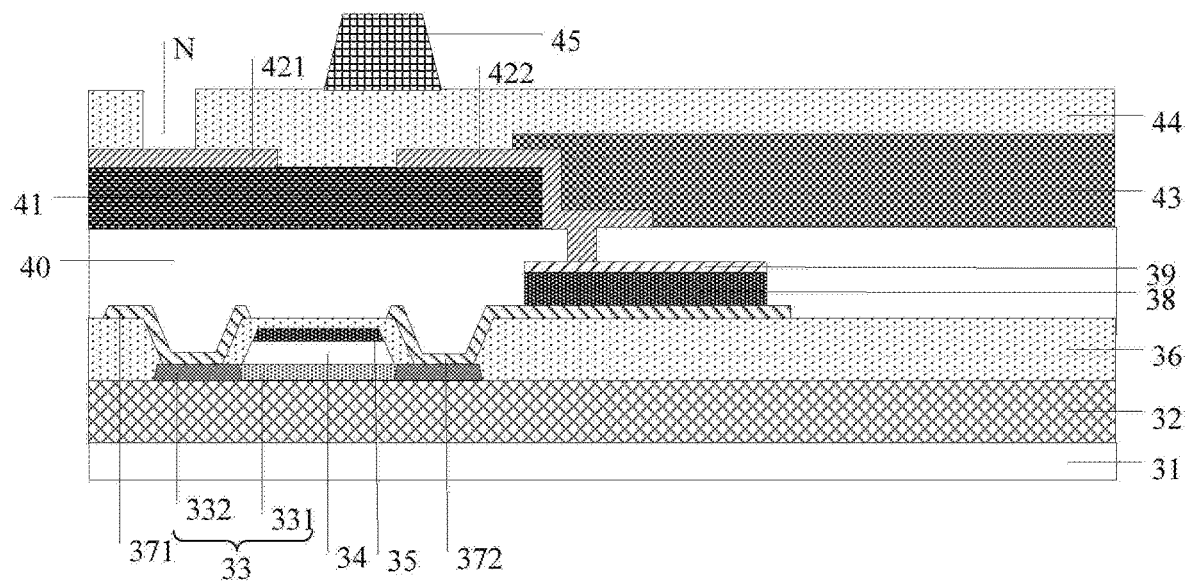
FIG. 8 shows a schematic structural view after forming a support pillar in an embodiment of the present disclosure.

As shown in FIG. 7, the second electrode connection hole N penetrating through the planar layer 44 is firstly disposed on the planar layer 44 through a patterning process, and then the support pillar 45 is disposed on the planar layer 44 to obtain a structure as shown in FIG. 8; of course, it is also possible to firstly form the support pillar 45 on the planar layer 44, and then form the second electrode connection hole N penetrating through the planar layer 44 on the planar layer 44. That is to say, the sequence in which the support pillar 45 and the second electrode connection hole N penetrating through the planar layer 44 are disposed on the planar layer 44 may be interchanged.

Figure 9:
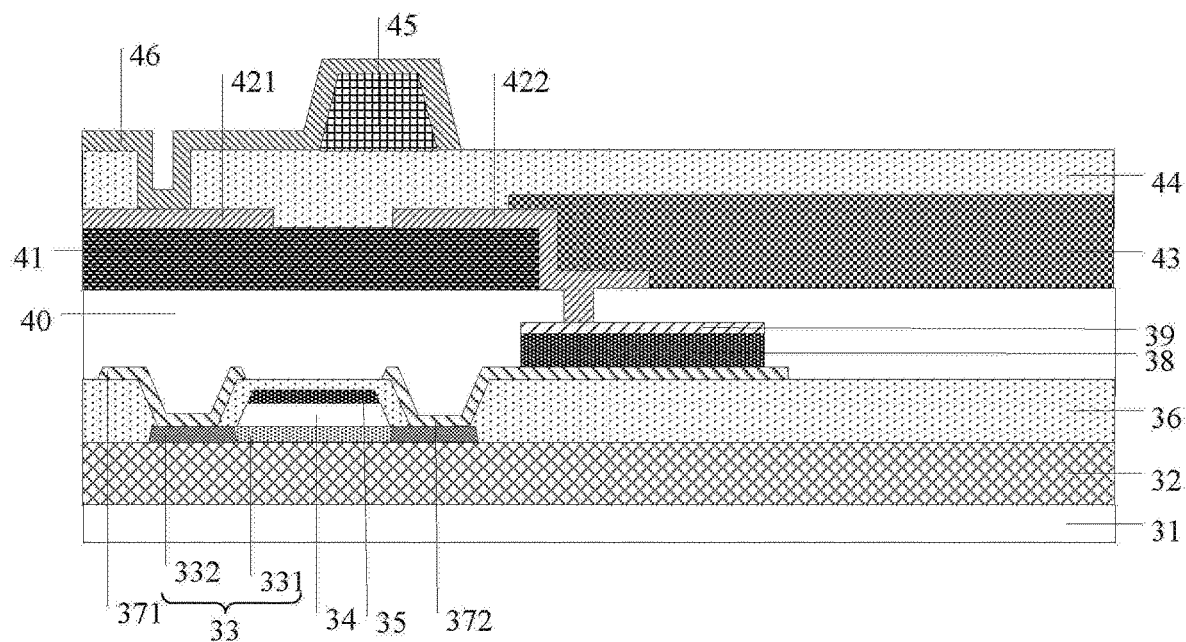
FIG. 9 shows a schematic structural view of a cover plate according to an embodiment of the present disclosure.

As shown in FIG. 9, the second electrode 46 is formed through a patterning process. The second electrode 46 covers the support pillar 45 and is connected to the auxiliary cathode 421 through the second electrode connection hole N; wherein the second electrode 46 may be made of a transparent conductive material such as ITO or IZO having a thickness of 400 Å to 1500 Å, for example, 600 Å, 800 Å, 1000 Å.

It should be noted that the patterning process in the embodiments of the present disclosure generally includes processes such as exposure, development, etching, and the like.

In an embodiment of the present disclosure, the method includes: sequentially forming a thin film transistor, an optical sensor, and a first electrode on the optical sensor on the first substrate through a patterning process; forming a passivation layer covering the thin film transistor and the first electrode; sequentially forming a black matrix and a first electrode connection hole penetrating through the passivation layer on the passivation layer through a patterning process; forming an electrode connection layer on the black matrix through a patterning process, wherein the electrode connection layer includes an auxiliary cathode and a first electrode connection line which are disposed in the same layer, and the first electrode connection line is connected with the first electrode through the first electrode connection hole; sequentially forming a color filter layer, a planar layer, a support pillar and a second electrode through a patterning process, wherein the second electrode is connected with the auxiliary cathode by a second electrode connection hole penetrating through the planar layer. The auxiliary cathode and the first electrode connection line are disposed through a patterning process once to reduce the number of fabricating process steps and reduce the fabricating cost, and the auxiliary cathode and the first electrode connection line are disposed in the same layer to save the occupied space of the cover plate.

An embodiment of the present disclosure provides a cover plate including a first substrate 31; a thin film transistor, an optical sensor 38, and a first electrode 39 on the optical sensor 38 sequentially disposed on the first substrate 31; a passivation layer 40 covering the thin film transistor and the first electrode 39; a black matrix 41 disposed on the passivation layer 40; an electrode connection layer 42 disposed on the black matrix 41, the electrode connection layer 42 including an auxiliary cathode 421 and a first electrode connection line 422 which are disposed in the same layer, and the first electrode connection line 422 being connected with the first electrode 39 by the first electrode connection hole M penetrating through the passivation layer 40; a color filter layer 43, a planar layer 44, a support pillar 45 and a second electrode 46 which are sequentially disposed, the second electrode 46 being connected with the auxiliary cathode 421 by a second electrode connection hole N penetrating through the planar layer 44.

The color filter layer 43 is disposed on the passivation layer 40. An orthographic projection of the color filter layer 43 on the passivation layer 40 partially covers the black matrix 41 and the first electrode connection line 422. The planar layer 44 covers the electrode connection layer 42, the black matrix 41, and the color filter layer 43. The planar layer 44 is disposed on the support pillar 45. The second electrode 46 covers the support pillar 45 and is connected with the auxiliary cathode 421 through the second electrode connection hole N.

In the embodiment of the present disclosure, the electrode connection layer 42 has a thickness of 2000 Å to 5000 Å.

The thin film transistor disposed on the first substrate 31 includes: a buffer layer 32 disposed on the first substrate 31; an active layer 33 disposed on the buffer layer 32; and a gate insulating layer 34 and a gate electrode 35 sequentially disposed on the active layer 33; an interlayer dielectric layer 36 covering the buffer layer 32, the active layer 33, the gate insulating layer 34, and the gate electrode 35; a source electrode 371 and a drain electrode 372 disposed on the interlayer dielectric layer 36, the source electrode 371 and the drain electrode 372 being respectively connected with the active layer 33 through via holes on the interlayer dielectric layer 36.

The optical sensor 38 is disposed on the drain electrode 372, and the first electrode 39 is disposed at a surface of the optical sensor 38 facing away from the drain electrode 372.

In an embodiment of the present disclosure, the cover plate includes a first substrate; a thin film transistor, an optical sensor, and a first electrode on the optical sensor which are sequentially disposed on the first substrate; a passivation layer covering the thin film transistor and the first electrode; a black matrix disposed on the passivation layer; an electrode connection layer disposed on the black matrix, the electrode connection layer including an auxiliary cathode and a first electrode connection line disposed in the same layer, and the first electrode connection line being connected with the first electrode by a first electrode connection hole penetrating through the passivation layer; a color filter layer, a planar layer, a support pillar and a second electrode sequentially disposed, the second electrode being connected with the auxiliary cathode by a second electrode connection hole penetrating through the planar layer. The auxiliary cathode and the first electrode connection line are disposed through a patterning process once to reduce the number of fabricating process steps and reduce the fabricating cost, and the auxiliary cathode and the first electrode connection line are disposed in the same layer to save the occupied space of the cover plate.

An embodiment of the present disclosure provides a display panel including the above-described cover plate.

Figure 10:
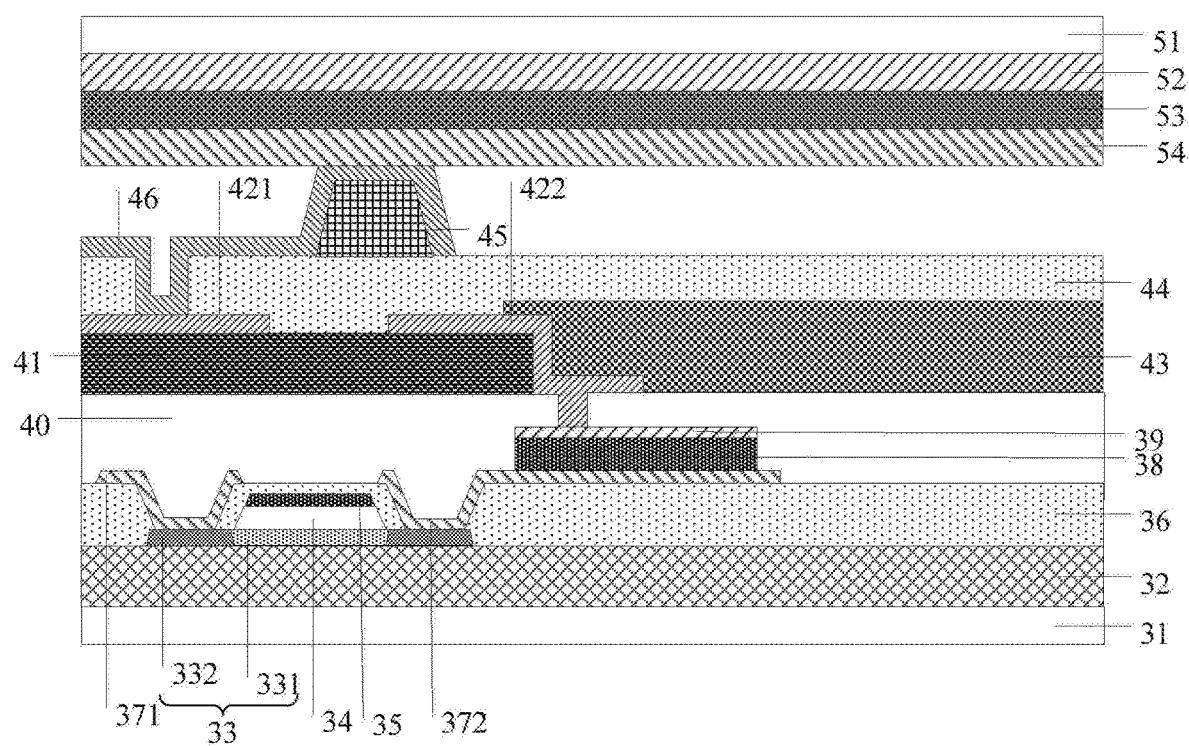
FIG. 10 is a schematic structural view of a display panel according to an embodiment of the present disclosure.

Referring to FIG. 10, a schematic structural view of a display panel of an embodiment of the present disclosure is shown.

In the embodiment of the present disclosure, the display panel further includes a display substrate, and the cover plate is disposed on the display substrate. The display substrate includes an anode 52, an organic light-emitting layer 53, and a cathode 54 stacked on the second substrate 51, and the cathode 54 is in contact with the second electrode 46.

As shown in FIG. 10, the cathode 54 is in contact with the second electrode 46 at a position where the support pillar 45 is located.

The cathode 54 is made of a transparent conductive material such as ITO or IZO; the cathode 54 is in contact with the second electrode 46, and the second electrode 46 is connected with the auxiliary cathode 421 through the second electrode connection hole N, thereby achieving connection between the cathode 54 and the auxiliary cathode 421.

For a detailed description of the cover plate, reference may be made to descriptions of the embodiments, and the details are not repeated herein.

An embodiment of the present disclosure further provides a display device including the above display panel, which is a top emission type OLED display panel.

In an embodiment of the present disclosure, a display panel includes a cover plate and a display substrate, the cover plate includes a first substrate; a thin film transistor, an optical sensor, and a first electrode on the optical sensor which are sequentially disposed on the first substrate; a passivation layer covering the thin film transistor and the first electrode; a black matrix disposed on the passivation layer; an electrode connection layer disposed on the black matrix, the electrode connection layer including an auxiliary cathode and a first electrode connection line disposed in the same layer, and the first electrode connection line being connected with the first electrode by a first electrode connection hole penetrating through the passivation layer; a color filter layer, a planar layer, a support pillar and a second electrode sequentially disposed, the second electrode being connected with the auxiliary cathode by a second electrode connection hole penetrating through the planar layer. The auxiliary cathode and the first electrode connection line are disposed through a patterning process once to reduce the number of fabricating process steps and reduce the fabricating cost, and the auxiliary cathode and the first electrode connection line are disposed in the same layer to save the occupied space of the cover plate. In addition, the cathode is connected with the auxiliary cathode through the second electrode to reduce the resistance of the cathode and improve the display quality of the display panel.

The present disclosure includes the following advantages over the prior art:

sequentially forming a thin film transistor, an optical sensor, and a first electrode on the optical sensor on the first substrate through a patterning process; forming a passivation layer covering the thin film transistor and the first electrode; sequentially forming a black matrix and a first electrode connection hole penetrating through the passivation layer on the passivation layer through a patterning process; forming an electrode connection layer on the black matrix through a patterning process, wherein the electrode connection layer includes an auxiliary cathode and a first electrode connection line disposed in the same layer, and the first electrode connection line is connected with the first electrode through the first electrode connection hole; sequentially forming a color filter layer, a planar layer, a support pillar and a second electrode through a patterning process, wherein the second electrode is connected with the auxiliary cathode by a second electrode connection hole penetrating through the planar layer. The auxiliary cathode and the first electrode connection line are disposed through a patterning process once to reduce the number of fabricating process steps and reduce the fabricating cost, and the auxiliary cathode and the first electrode connection line are disposed in the same layer to save the occupied space of the cover plate.

In the foregoing method embodiments, for the sake of simple description, they are all expressed as combinations of a series of actions, but those skilled in the art should understand that the present disclosure is not limited by the described action sequence. According to the present disclosure, these steps can be performed in other sequences or simultaneously. In addition, those skilled in the art should also understand that all of the embodiments described in the specification belong to preferred embodiments, and the actions and modules involved are not necessarily required by the present disclosure.

The various embodiments in the present specification are described in a progressive manner, and each embodiment focuses on differences from other embodiments, and the same or similar parts between the various embodiments can be referred to each other.

Finally, it should also be noted that in this context, relational terms such as first and second are used merely to distinguish one entity or operation from another entity or operation, and do not necessarily require or imply any such actual relationship or sequence between these entities or operations. Furthermore, the terms "comprise", "include" or any other variations are intended to encompass a non-exclusive inclusion, such that a process, a method, a commodity, or a device including a series of elements not only include these elements, but other elements which are not definitely listed, or include elements which are inherent to such a process, a method, a commodity, or a device. An element defined by the phrase "comprising a . . . " does not exclude the presence of additional equivalent elements in the process, method, commodity, or device including the element without any more limitation.

A cover plate, a fabricating method thereof, a display panel, and a display device provided by the present disclosure are described in detail. The principles and embodiments of the present disclosure are described in the following by applying specific examples. The description of the above embodiments is only intended to facilitate understanding a method and its core idea of the present disclosure; at the same time, according to the idea of the present disclosure, there will be changes in specific embodiments and application scopes for those skilled in the art. The contents of the specification should not be construed as limitation of the present disclosure.

What is claimed is:

1. A fabricating method of a cover plate, comprising:
sequentially forming a thin film transistor, an optical sensor, and a first electrode on the optical sensor on a first substrate through a patterning process;
forming a passivation layer covering the thin film transistor and the first electrode;
sequentially forming a black matrix and a first electrode connection hole penetrating through the passivation layer on the passivation layer through a patterning process;
forming an electrode connection layer on the black matrix through a patterning process, wherein the electrode connection layer comprises an auxiliary cathode and a first electrode connection line which are disposed in a same layer, and the first electrode connection line is connected with the first electrode through the first electrode connection hole; and
sequentially forming a planar layer and a second electrode through a patterning process, the second electrode being connected with the auxiliary cathode by a second electrode connection hole penetrating through the planar layer.

2. The fabricating method according to claim 1, wherein the step of sequentially forming the planar layer and the second electrode through the patterning process comprises:
forming a color filter layer on the passivation layer through a patterning process;
forming the planar layer covering the electrode connection layer, the black matrix and the color filter layer;
sequentially forming a support pillar and a second electrode connection hole penetrating through the planar layer on the planar layer by patterning process; and
forming the second electrode through a patterning process, the second electrode covering the support pillar, and being connected with the auxiliary cathode through the second electrode connection hole.

3. The fabricating method according to claim 2, wherein the step of forming the color filter layer on the passivation layer through the patterning process comprises: an orthographic projection of the color filter layer on the passivation layer partially covering the black matrix and the first electrode connection line.

4. The fabricating method according to claim 1, wherein the step of sequentially forming the thin film transistor, the optical sensor, and the first electrode on the optical sensor on the first substrate through the patterning process comprises:
forming a buffer layer on the first substrate;
forming an active layer on the buffer layer by patterning process;
sequentially forming a gate insulating layer and a gate electrode on the active layer by patterning process;
forming an interlayer dielectric layer by patterning process, the interlayer dielectric layer covering the buffer layer, the active layer, the gate insulating layer, and the gate electrode;
forming a source electrode and a drain electrode on the interlayer dielectric layer by patterning process, the source electrode and the drain electrode being respectively connected with the active layer through via holes on the interlayer dielectric layer;
forming an optical sensor on the drain electrode; and
forming the first electrode at a surface of the optical sensor facing away from the drain electrode.

5. A cover plate comprising:
a first substrate;
a thin film transistor, an optical sensor, and a first electrode on the optical sensor which are sequentially disposed on the first substrate;
a passivation layer covering the thin film transistor and the first electrode;
a black matrix disposed on the passivation layer;
an electrode connection layer disposed on the black matrix, the electrode connection layer comprising an auxiliary cathode and a first electrode connection line which are disposed in a same layer, and the first electrode connection line being connected with the first electrode by a first electrode connection hole penetrating through the passivation layer; and
a planar layer and a second electrode sequentially disposed, the second electrode being connected with the auxiliary cathode by a second electrode connection hole penetrating through the planar layer.

6. The cover plate according to claim 5, further comprising a color filter layer disposed on the passivation layer and a support pillar, the planar layer covering the electrode connection layer, the black matrix, and the color filter layer, the support pillar being disposed on the planar layer, the second electrode covering the support pillar, and being connected with the auxiliary cathode through the second electrode connection hole.

7. The cover plate according to claim 6, wherein an orthographic projection of the color filter layer on the passivation layer partially covers the black matrix and the first electrode connection line.

8. The cover plate according to claim 5, wherein the electrode connection layer has a thickness of 2000 Å to 5000 Å.

9. The cover plate according to claim 5 wherein the thin film transistor comprises:
   a buffer layer disposed on the first substrate;
   an active layer disposed on the buffer layer;
   a gate insulating layer and a gate electrode sequentially disposed on the active layer;
   an interlayer dielectric layer covering the buffer layer, the active layer, the gate insulating layer, and the gate electrode; and
   a source electrode and a drain electrode disposed on the interlayer dielectric layer, the source electrode and the drain electrode being respectively connected with the active layer through via holes on the interlayer dielectric layer.

10. The cover plate according to claim 9, wherein the optical sensor is disposed on the drain electrode, and the first electrode is disposed at a surface of the optical sensor facing away from the drain electrode.

11. A system, comprising:
   a display panel, wherein the display panel comprises a cover plate comprising:
      a first substrate;
      a thin film transistor, an optical sensor, and a first electrode on the optical sensor which are sequentially disposed on the first substrate;
      a passivation layer covering the thin film transistor and the first electrode;
      a black matrix disposed on the passivation layer;
      an electrode connection layer disposed on the black matrix, the electrode connection layer comprising an auxiliary cathode and a first electrode connection line which are disposed in a same layer, and the first electrode connection line being connected with the first electrode by a first electrode connection hole penetrating through the passivation layer; and
      a planar layer and a second electrode sequentially disposed, the second electrode being connected with the auxiliary cathode by a second electrode connection hole penetrating through the planar layer.

12. The system according to claim 11, further comprising:
   a display substrate on which the cover plate is disposed; and
   an anode, an organic light emitting layer, and a cathode stacked on the second substrate, the cathode being in contact with the second electrode.

13. The system according to claim 12, wherein the cover plate further comprises:
   a color filter layer disposed on the passivation layer; and
   a support pillar, wherein the planar layer covers the electrode connection layer, the black matrix, and the color filter layer, the support pillar being disposed on the planar layer;
   wherein the second electrode covers the support pillar, and is connected with the auxiliary cathode through the second electrode connection hole.

14. The system according to claim 13, wherein the cathode is in contact with the second electrode at a position where the support pillar is located.

15. The system according to claim 11, further comprising a display device comprising the display panel, the display panel comprising the cover plate.

* * * * *